United States Patent [19]
Selvin et al.

[11] 4,116,517
[45] Sep. 26, 1978

[54] FLEXIBLE PRINTED CIRCUIT AND ELECTRICAL CONNECTION THEREFOR

[75] Inventors: Gerald J. Selvin, Huntington Beach; John R. Moore, Santa Ana, both of Calif.

[73] Assignee: International Telephone and Telegraph Corporation, New York, N.Y.

[21] Appl. No.: 747,238

[22] Filed: Dec. 3, 1976

Related U.S. Application Data

[63] Continuation-in-part of Ser. No. 673,958, Apr. 15, 1976, abandoned.

[51] Int. Cl.² .................................................. H05K 1/02
[52] U.S. Cl. .................................. 339/17 F; 339/61 M; 339/176 MF
[58] Field of Search ............... 339/17 F, 61 R, 61 M, 339/176 MF

[56] References Cited

U.S. PATENT DOCUMENTS

| | | | |
|---|---|---|---|
| 3,546,775 | 12/1970 | Lalmond | 339/17 F |
| 3,562,798 | 2/1971 | Bragg | 339/17 F |
| 3,851,294 | 11/1974 | Palazzetti et al. | 339/17 F |
| 3,924,915 | 12/1975 | Conrad | 339/17 F |
| 3,967,162 | 6/1976 | Ceresa | 339/61 M |

OTHER PUBLICATIONS

Electronic Technican; Oct. 1959; p. 79.
Flexprint, advertisement in Electronic Design, Dec. 9, 1959, p. 135.

*Primary Examiner*—Gerald A. Dost
*Attorney, Agent, or Firm*—Thomas L. Peterson

[57] ABSTRACT

A flexible printed circuit is electrically connected to a printed circuit board or the like without the use of intermediate conducting contact elements. The flexible printed circuit has conductive strips thereon each terminating in a conductive pad. The pads and the areas of the insulation sheet of the circuit underlying the pads are deformed to provide contact projections defining cavities therebelow. A backing layer of elastomeric material underlying the insulation sheet embodies points which extend into the cavities. The flexible printed circuit is clamped against the printed circuit board causing the elastomeric layer to be compressed so that the points fill the contact cavities to produce a high-force localized contact between the contact projections and the traces on the printed circuit board. A multi-layer, flexible printed circuit arrangement is also disclosed.

9 Claims, 5 Drawing Figures

FLEXIBLE PRINTED CIRCUIT AND ELECTRICAL CONNECTION THEREFOR

CROSS-REFERENCE TO RELATED APPLICATION

This application is a continuation-in-part of our co-pending application Ser. No. 673,958, filed Apr. 15, 1976 now abandoned, assigned to the assignee of the present application.

BACKGROUND OF THE INVENTION

The present invention relates generally to an electrical connection assembly and, more particularly, to such an assembly wherein a flexible printed circuit is electrically connected to a planar wiring pattern element such as a printed circuit board.

The use of flexible printed circuits has become quite widespread because of their low cost, ease of assembly in interconnection systems, and the low volumes which they occupy in the systems. Various means have been utilized for connecting the flexible printed circuits to like circuits, or to rigid circuits such as printed circuit boards. Typically such connecting means employ intermediate conducting contact elements between the conductive strips on the flexible printed circuit and the element to which it is connected. In order to decrease costs and the handling of extra components, it would be desirable to avoid the use of the intermediate conducting contact elements.

Reference is made to U.S. Pat. No. 3,900,242 to Maheux et al. which discloses one approach for providing an electrical connection between a pair of flexible printed circuits without the use of intermediate conducting contact elements. In the Maheux et al. patent, there is disclosed a pair of flexible printed circuits clamped between two members having opposed surfaces. The surface of one member is slightly out of parallelism with the surface of the other member. Pins project slightly through the surface of the one member, a pin for each pair of opposed conductors of the flexible printed circuits. As the clamping members are moved into final clamping relationship, the one member distorts and the pins are given a small swinging movement normal to the planes of the conductors. This clamping movement causes a wiping action to be produced at the point of contact between the conductors on the flexible circuits. Such wiping action does not produce as high a localized contact force between the conductors on the circuits as is required for numerous applications. Further, the use of a movable clamping member with projecting pins thereon to produce the wiping action between the conductors of the flexible printed circuits adds to the cost of the connection assembly.

It is the purpose of the present invention to provide an improved, low cost connection arrangement for a flexible printed circuit and a printed circuit board or like planar wiring pattern element, which does not require the use of intermediate conducting contact elements.

SUMMARY OF THE INVENTION

According to the principal aspect of the present invention, there is provided a connection assembly for making electrical connections between the conductive strips on a flexible printed circuit and the traces on a printed circuit board or the like. The flexible printed circuit comprises a flexible insulation sheet having one or more conductive strips thereon terminating in conductive pads. Each pad and the area of the insulation sheet underlying the pad is deformed to provide a hollow, upwardly extending contact projection which defines a cavity therebelow. A layer of elastomeric material underlies the insulation sheet. The elastomeric layer embodies upwardly protruding points which extend into the cavities formed by the contact projections on the flexible printed circuit into engagement with the traces on the printed circuit board. Compression of the elastomeric layer causes the points thereof to fill the contact cavities underload, thereby causing a high-force localized contact to be produced between the contact projections and the traces on the printed circuit board. The high-force localized contact achieved by the present invention assures that reliable electrical connections are made between the strips on the flexible printed circuit and the printed circuit board. Such connection is made without the use of intermediate conducting contact elements, thereby providing a low cost interconnection assembly.

DESCRIPTION OF THE PREFERRED EMBODIMENTS

Figure 1:
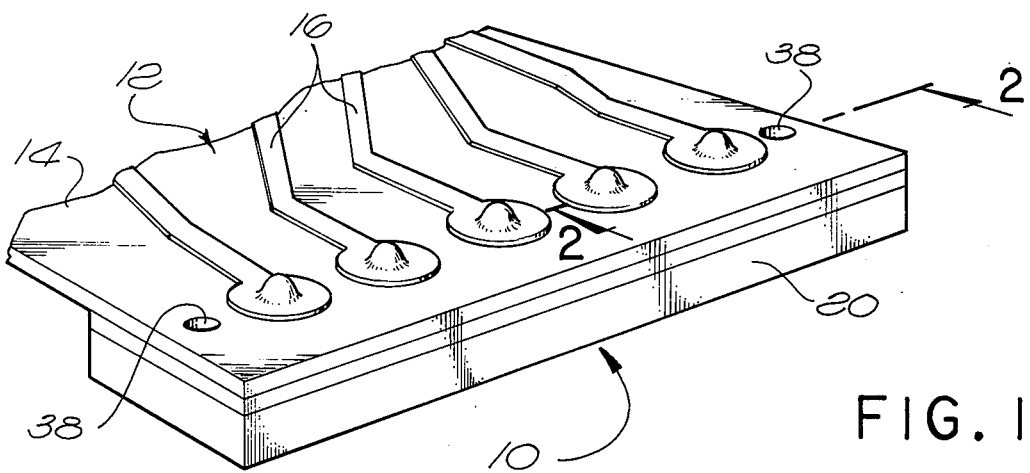
FIG. 1 is a fragmentary, perspective view of the end of the flexible printed circuit of the present invention with a pressure plate mounted thereon.
Figure 2:
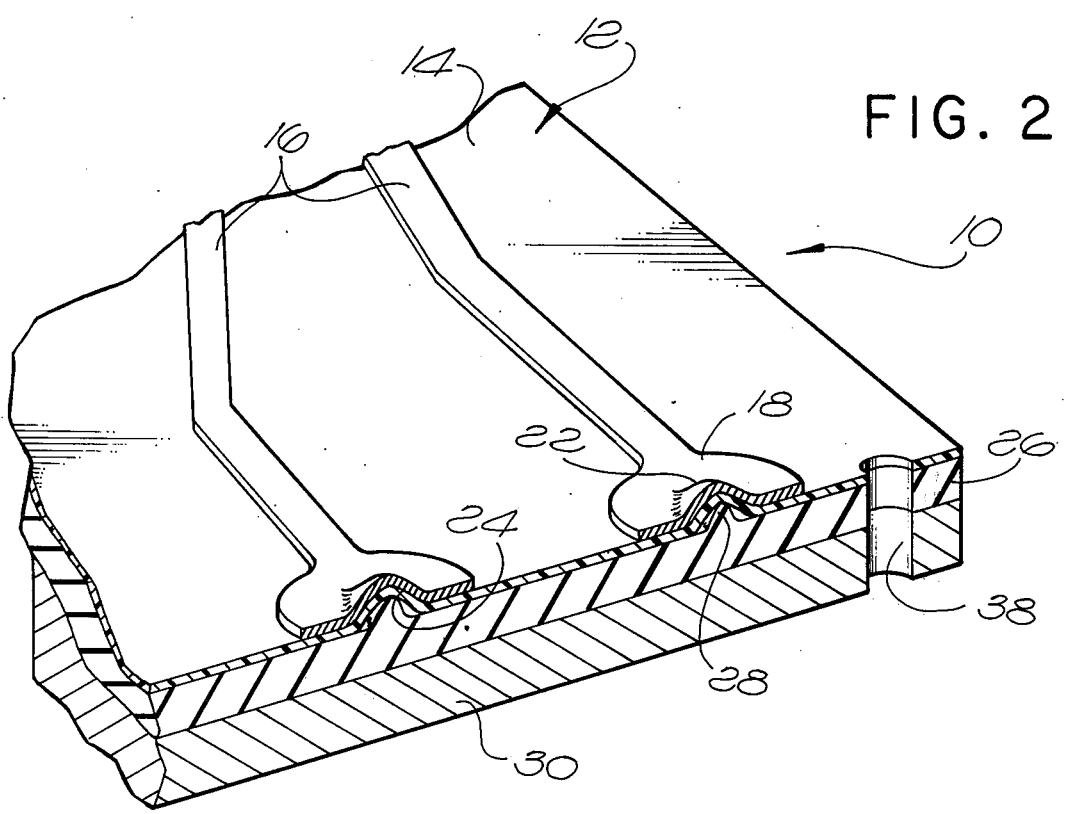
FIG. 2 is a perspective vertical sectional view taken along line 2—2 of FIG. 1 showing the details of structure of the contact projections for two conductive strips on the flexible printed circuit.

Referring now to FIGS. 1 and 2 of the drawings in detail, there is illustrated the flexible printed circuit assembly of the present invention, generally designated 10. The assembly 10 comprises a flexible printed circuit 12 which consists of a flexible insulation sheet 14 having conductive strips 16 on the upper surface thereof. The insulation sheet 14 may be formed of suitable plastic material, such as Kapton polyimide film, or Mylar oriented polyester film. The conductive strips may be copper of ½ oz. or more, or other suitable conductive materials. The conductive strips 16 terminated in circular conductive pads 18 adjacent to the forward edge 20 of the circuit. Preferably the pads 18 are provided in a straight row along the edge 20. However, it will be appreciated that the pads could be arranged in any desired pattern so long as they will be oriented to engage the conductive traces on a printed circuit board to which they are to be electrically connected when the flexible circuit and board are clamped together in a manner to be described later herein.

The conductive pads 18 and the area of the insulation sheet 14 underlying the pads are deformed to provide hollow, upwardly extending contact projections 22 in the center of the pads. Each projection defines therebelow a cavity 24. The flexible circuit 12 may be deformed to provide the contact projections 22 by the use of any suitable tool. The projections provide miniature contact points or hemispheres. A layer 26 of elastomeric material underlies the flexible circuit 12 in the region of the conductive pads 18. Preferably the layer 26 underlies the entire lower surface of the flexible circuit along the forward edge 20 thereof. The elastomeric material may be a suitable rubber, preferably of low compression set, in the range of 10%. The elastomeric layer is adhered to the lower surface of the flexible circuit 12 by heat bonding, cement, or the like.

The elastomeric layer is formed with a plurality of upwardly protruding integral points 28 which extend into the cavities 24 formed by the contact projections 22. The points 28 may either loosely fit within the cavities or may be adhered to the walls thereof by suitable bonding techniques. In any event, the points are shaped so that when the elastomeric layer is compressed the points will tend to fill the cavities 24 underload so as to press on the back of the contact projections, thereby producing a high force localized contact between the conductive traces on the flexible printed circuit assembly 10 and the traces on a printed circuit element to which it is attached.

Backing the elastomeric layer is a rigid pressure plate 30 which may be formed of plastic or metal, as shown. The pressure plate may be adhered to the elastomeric layer 26 by heat bonding or cement.

Figure 3:
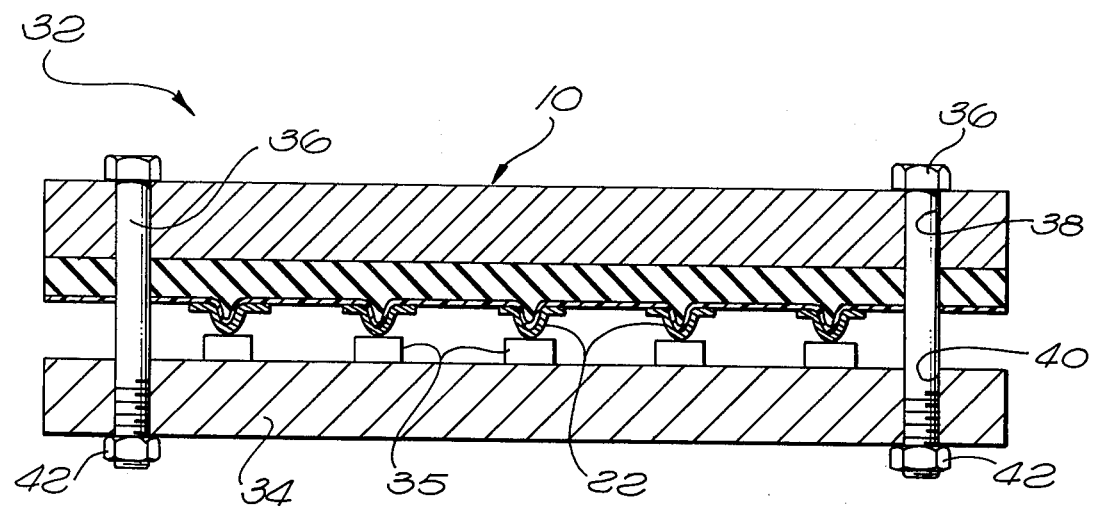
FIG. 3 is a vertical sectional view through a connection assembly in accordance with the present invention employing the flexible printed circuit of FIG. 1.

Reference is now made to FIG. 3 of the drawings in detail which illustrates the connection assembly of the present invention, generally designated 32, that utilizes the flexible printed circuit assembly 10. The assembly 32 simply consists of the flexible printed circuit assembly 10 and the planar wiring pattern element to which it is to be connected, for example—a printed circuit board 34, and clamping means for holding the two parts together. Conductive traces 35 are provided on the upper surface of the board. The contact projections 22 overlie the traces 35.

The clamping means for the assembly 32 may take any suitable form. As illustrated, the clamping means consists of a pair of screws 36 which pass through openings 38 and 40 in the flexible printed circuit assembly 10 and printed circuit board 34, respectively. The tightening of nuts 42 on the screws draw the flexible printed circuit assembly 10 and printed circuit board 34 together causing the elastomeric layer 26 to compress. Compression of the elastomeric layer causes the protruding points 28 thereon to fill the cavities 24 under load, thereby functioning as spring members or elastic backing for the contact projections 22. This results in a high force localized contact being produced between the projections 22 and the conductive traces 35 on the printed circuit board 34.

Thus, by the present invention, the conductive pads on a flexible printed circuit are deformed to provide integral contact projections. The elastomeric layer underlying the circuit is compressed to provide a spring action which resiliently forces the contact projections into reliable, high force electrical contact with the traces on the printed circuit board 34 when the flexible printed circuit assembly 10 and the board are clamped together by screws 36. Obviously, other clamping means may be utilized, for example—toggle clamps, latches, or the like.

Figure 4:
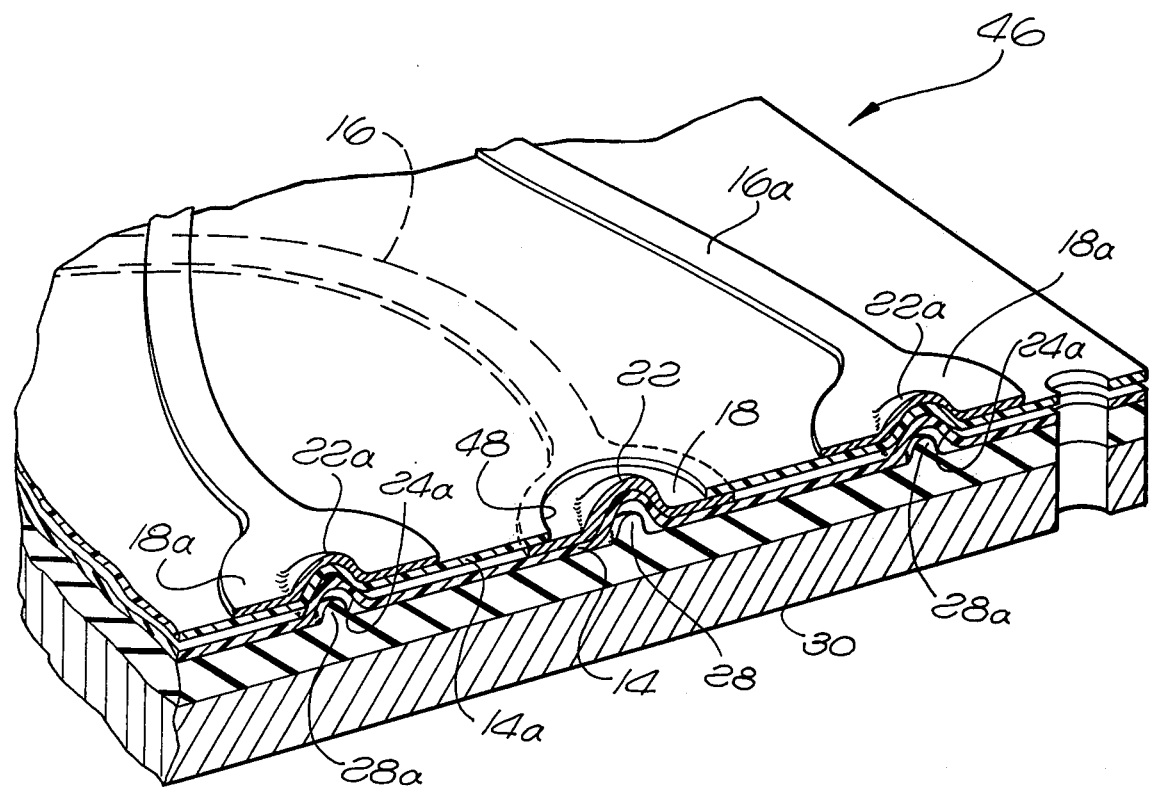
FIG. 4 is a perspective sectional view similar to FIG. 2 illustrating a multi-layer flexible printed circuit in accordance with the invention.

Reference is made to FIG. 4 of the drawing which illustrates a multi-layer flexible printed circuit assembly in accordance with the present invention, generally designated 46. The assembly 46 is similar to the assembly 10 except that it includes a second insulation sheet 14a with conductive strips 16a on the upper surface thereof. The strips terminate in conductive pads 18a. The pads 18a are spaced from the pad 18 on the insulation sheet 14, but the conductive traces 16a may cross the conductive traces 16 on the insulation 14 since they lie in different planes. A circular opening 48 is formed in the insulation sheet 14a over the pad 18 so that the contact projection 22 may extend upwardly through the opening. The pads 18a and the areas of the insulation sheets 14 and 14a below the pads are deformed upwardly to provide hollow, upwardly extending contact projections 22a, similar to the projection 22. The elastomeric layer 26 is formed with additional integral upwardly protruding points 28a which extend into the cavities 24a formed by the projections 22a. A rigid pressure plate 30 underlies the elastomeric layer 26 as in the first embodiment of the invention. The multi-layer flexible printed circuit assembly 46 of FIG. 4 may be electrically connected to a printed circuit board by the use of the clamping arrangement as illustrated in FIG. 3 and described previously herein.

Figure 5:
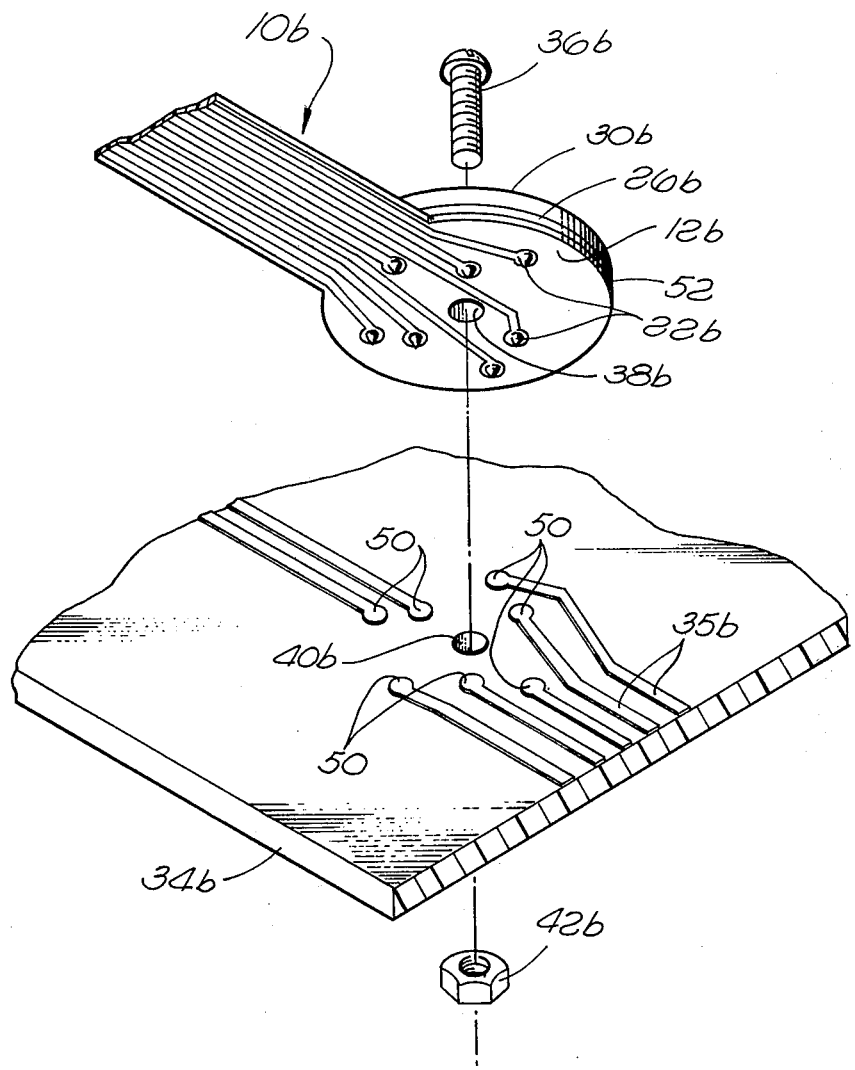
FIG. 5 is an exploded view of an alternative connection assembly.

Reference is made to FIG. 5 which illustrates a connection assembly in accordance with the invention which is a modification of the assembly 32 shown in FIG. 3. In FIG. 5, reference numerals identical to those used in FIGS. 1 to 3 are used to indicate like or corresponding parts, with the suffix "b" added. The printed circuit board 34b of the assembly 32b differs from the board 34 of FIG. 3 in that the conductive traces 35b terminate in conductive pads 50 arranged in a non-linear pattern. As illustrated, the pads lie on two imaginary concentric circles. The pads may be located in any random pattern depending upon the requirements of the user. A hole 40b is located in the center of the circular array of pads.

The flexible printed circuit assembly 10b of FIG. 5 terminates in a circular end section 52 including a flexible printed circuit 12b, an elastomeric layer 26b and pressure plate 30b. The flexible circuit 12b embodies a plurality of contact projections 22b (identical to projections 22) disposed in a pattern matching the pattern of conductive pads 50 on the printed circuit board 34b. A central hole 38b is formed in the circular end section 52 of the circuit assembly 10b. The printed circuit assembly 10b is mounted flat on the board 34b with the holes 38b and 40b aligned and the contact projections 22b overlying the pads 50. A suitable keying arrangement, not shown, may be used to assure that the contact projections register with the conductive pads. A screw 36b is inserted throught the holes 38b and 40b. A nut 42b is threaded on the screw below the board 34b and tightened to draw the flexible printed circuit assembly 10b and board 34b together causing the contact projections 22b to engage the pads 50 with a high unit force.

It will be appreciated that by the present invention, contact projections may be easily formed on a flexible circuit by the use of a suitable punching tool in any desired pattern thereby making it possible to make electrical contact between the conductors of the flexible circuit and traces formed in any random pattern on a printed circuit board.

We claim:

1. A printed circuit board connection assembly comprising:
    a relatively rigid printed circuit board having a plurality of traces thereon;
    a relatively flexible printed circuit comprising a flexible insulation sheet having a planar area generally parallel to said board and embodying conductive strips on the side thereof facing said board;

said conductive strips having contact projections thereon in said planar area arranged in a non-linear pattern matching selected areas of said traces on said board whereby said contact projections will be in registry with said selected areas, each said projection have a generally hermispherical configuration;

an elastomeric member on the side of said sheet opposite to said one side underlying said contact projections;

a relatively rigid pressure plate behind said elastomeric member; and means for moving said board and said pressure plate toward each other to compress said elastomeric member and, thereby, resiliently urge said contact projections into electrical contact with said traces on said board.

2. A flexible printed circuit comprising:
a flexible insulation sheet having a plurality of conductive strips thereon each terminating in a conductive pad;

said pads being arranged in a non-linear pattern;

each said pad and the area of the insulation sheet underlying said pad being deformed to provide a hollow, upwardly extending contact projection defining a cavity therebelow, said projection having a generally hemispherical configuration; and a layer of elastomeric material underlying said sheet in the region of said projections and embodying upwardly protruding points extending into said cavities.

3. A flexible printed circuit as set forth in claim 2 wherein:
said elastomeric layer is adhered to the lower surface of said sheet.

4. A flexible printed circuit as set forth in claim 2 including:
a rigid pressure plate underlying said elastomeric layer in the region of said projections, said plate being adhered to said layer.

5. A flexible printed circuit as set forth in claim 2 in combination with a printed circuit element having a plurality of conductive traces on one surface thereof;
said traces having selected areas arranged in a pattern matching said non-linear pattern of said pads;
said element being positioned parallel to said flexible printed circuit with the traces thereon facing said pads with the selected areas thereof in registry with said projections; and
means for moving said element and flexible printed circuit toward each other to compress said elastomeric layer and, thereby, resiliently urge said projections into electrical contact with said selected areas of said traces.

6. A flexible printed circuit comprising:
a flexible insulation sheet having a planar area;
a plurality of conductive strips on said sheet extending into said planar area;
each said conductive strip having an upwardly extending contact projection thereon in said planar area, said projection having a generally hemispherical configuration;
said projections being arranged in said planar area in a non-linear pattern; and
an elastomeric member underlying said sheet at least in the region of said contact projections.

7. A flexible printed circuit as set forth in claim 6 wherein:
said contact projections are disposed in said planar area in a circular array.

8. A flexible printed circuit as set forth in claim 7 including:
a rigid pressure plate underlying said elastomeric member; and
an aperture extending through said sheet, said elastomeric member and said pressure plate generally in the center of said circular array.

9. A flexible printed circuit comprising:
a flexible insulation sheet having at least one conductive strip thereon terminating in a conductive pad;
said pad and the area of the insulation sheet underlying said pad being deformed to provide a hollow, upwardly extending contact projection defining a cavity therebelow, said projection having a generally hemispherical configuration;
a layer of elastomeric material underlying said sheet in the region of said projection and embodying an upwardly protruding point extending into said cavity;
a second flexible insulation sheet above said first-mentioned sheet and having an opening therein aligned with said projection, said projection extending upwardly through said opening and above the upper surface of said second sheet;
a second conductive strip on said second sheet terminating in a second conductive pad remote from said opening;
said second pad and the areas of said first and second insulation sheets underlying said second pad being deformed to provide a second hollow, upwardly extending projection defining a second cavity therebelow, said second projection having a generally hemispherical configuration; and
said elastomeric layer embodying a second upwardly protruding point extending into said second cavity.

* * * * *